(12) United States Patent
Sunagawa et al.

(10) Patent No.: US 9,206,502 B2
(45) Date of Patent: Dec. 8, 2015

(54) IN—GA—ZN OXIDE SPUTTERING TARGET AND METHOD FOR PRODUCING SAME

(75) Inventors: Misa Sunagawa, Sodegaura (JP); Masayuki Itose, Sodegaura (JP); Mami Nishimura, Sodegaura (JP); Masashi Kasami, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 217 days.

(21) Appl. No.: 14/116,299

(22) PCT Filed: Apr. 27, 2012

(86) PCT No.: PCT/JP2012/002917
§ 371 (c)(1),
(2), (4) Date: Dec. 27, 2013

(87) PCT Pub. No.: WO2012/153491
PCT Pub. Date: Nov. 15, 2012

(65) Prior Publication Data
US 2014/0145124 A1    May 29, 2014

(30) Foreign Application Priority Data

May 10, 2011    (JP) .................................. 2011-105720

(51) Int. Cl.
*H01B 1/02*    (2006.01)
*C23C 14/08*    (2006.01)
(Continued)

(52) U.S. Cl.
CPC ............... *C23C 14/086* (2013.01); *C04B 35/01* (2013.01); *C04B 35/453* (2013.01); *C04B 35/62675* (2013.01); *C04B 35/6455* (2013.01); *C23C 14/08* (2013.01); *C23C 14/3414* (2013.01); *H01B 1/08* (2013.01); *H01L 29/24* (2013.01); *C04B 2235/3284* (2013.01); *C04B 2235/3286* (2013.01); *C04B 2235/40* (2013.01); *C04B 2235/44* (2013.01); *C04B 2235/5409* (2013.01); *C04B 2235/604* (2013.01); *C04B 2235/652* (2013.01); *C04B 2235/658* (2013.01); *C04B 2235/6562* (2013.01);
(Continued)

(58) Field of Classification Search
CPC ..................... H01L 21/02667; H01L 29/7869; C23C 14/08; C04B 35/457
USPC ........... 252/512, 519.51; 204/192.18, 192.25, 204/298.13
See application file for complete search history.

(56) References Cited

U.S. PATENT DOCUMENTS

2004/0180217 A1    9/2004    Inoue et al.
2011/0260118 A1    10/2011   Yano et al.

FOREIGN PATENT DOCUMENTS

| CN | 1545567 A | 11/2004 |
| CN | 101663250 A | 3/2010 |

(Continued)

OTHER PUBLICATIONS

International Search Report in connection with application No. PCT/JP2012/002917 issued on Nov. 21, 2013.
(Continued)

*Primary Examiner* — Khanh Tuan Nguyen
(74) *Attorney, Agent, or Firm* — Foley & Lardner LLP

(57) ABSTRACT

A sputtering target including an oxide A and InGaZnO$_4$, the oxide A having a diffraction peak in regions A to K at 2θ=7.0° to 8.4°, 30.6° to 32.0°, 33.8° to 35.8°, 53.5° to 56.5°, 56.5° to 59.5°, 14.8° to 16.2°, 22.3° to 24.3°, 32.2° to 34.2°, 43.1° to 46.1°, 46.2° to 49.2°, and 62.7° to 66.7°.

8 Claims, 2 Drawing Sheets

(51) Int. Cl.
| | |
|---|---|
| *C04B 35/01* | (2006.01) |
| *C04B 35/453* | (2006.01) |
| *C04B 35/626* | (2006.01) |
| *C04B 35/645* | (2006.01) |
| *C23C 14/34* | (2006.01) |
| *H01B 1/08* | (2006.01) |
| *H01L 29/24* | (2006.01) |
| *H01L 21/02* | (2006.01) |

(52) U.S. Cl.
CPC ............... *C04B 2235/6565* (2013.01); *C04B 2235/6567* (2013.01); *C04B 2235/763* (2013.01); *C04B 2235/77* (2013.01); *C04B 2235/80* (2013.01); *H01L 21/02554* (2013.01); *H01L 21/02565* (2013.01); *H01L 21/02631* (2013.01)

(56) References Cited

FOREIGN PATENT DOCUMENTS

| | | |
|---|---|---|
| JP | 2009-275272 | 11/2009 |
| JP | 2010-202451 | 9/2010 |
| WO | WO-2009/148154 A1 | 12/2009 |
| WO | WO-2009/151003 | 12/2009 |
| WO | WO-2009/157535 | 12/2009 |
| WO | WO-2010/140548 | 12/2010 |
| WO | WO-2011/061923 | 5/2011 |
| WO | WO-2011/061936 | 5/2011 |

OTHER PUBLICATIONS

Nomura et al., Room-temperature fabrication of transparent flexible thin-film transistors using amorphous oxide semiconductors, Nature 432, Nov. 25, 2004.

Chinese Office Action dated Feb. 28, 2015 issued in Application No. 201280022417.7.

IN—GA—ZN OXIDE SPUTTERING TARGET AND METHOD FOR PRODUCING SAME

This application is the National Phase of PCT/JP2012/002917, filed Apr. 27, 2012, which claims priority to Japanese Application No. 2011-105270, filed May 10, 2011, the disclosures of which are hereby incorporated by reference in their entirety.

TECHNICAL FIELD

The invention relates to a sputtering target (target) for producing an oxide thin film such as an oxide semiconductor or a transparent conductive film.

BACKGROUND ART

An amorphous oxide film consisted of indium oxide, zinc oxide, and gallium oxide allows visible light to pass through, and has a wide range of electrical properties (i.e., electrical properties ranging from those of a conductor or a semiconductor to those of an insulator). Therefore, such an amorphous oxide film has attracted attention as a transparent conductive film or a semiconductor film (e.g., a semiconductor film used for a thin film transistor (TFT)).

In particular, an In—Ga—Zn oxide semiconductor has attracted attention after a paper relating to an In—Ga—Zn oxide semiconductor was published by Nomura, Hosono, et al. (see Non-patent Document 1).

It has been studied to form such an oxide film using a physical film-forming technique (e.g., sputtering, pulsed laser deposition (PLD), or evaporation) or a chemical film-forming technique (e.g., sol-gel method). In particular, a film-forming technique by sputtering has been studied at a practical level since a film can be uniformly formed over a large area at a relatively low temperature. When forming an oxide thin film by a physical film-forming technique such as sputtering, a target consisted of an oxide sintered body is generally used in order to form the oxide thin film uniformly, stably, and efficiently (i.e., at a high rate).

It is desirable that a target used for sputtering exhibit high conductivity, and rarely cause or show an abnormal discharge and nodules. However, it is difficult to produce an In—Ga—Zn target having such characteristics. This is because the properties and the state of the target change depending on the production conditions and the composition, and a change in conductivity or a change in occurrence probability of nodules and an abnormal discharge occurs.

It has been found that it is very effective to reduce the content of the spinel phase represented by $ZnGa_2O_4$ in the target composition in order to obtain an In—Ga—Zn target that rarely causes or shows an abnormal discharge and nodules (see Patent Document 1). In Patent Document 1, the content of the spinel phase is reduced by adjusting the specific surface area of an $In_2O_3$ raw material powder to 10 m$^2$/g or less, and grinding the raw material powder so that the difference between the specific surface area before grinding and the specific surface area after grinding is 2.0 m$^2$/g or more.

RELATED-ART DOCUMENT

Patent Document

Patent Document 1: WO2009/151003

Non-Patent Document

Non-patent Document 1: K. Nomura et al, Nature 432, 488 (2004)

SUMMARY OF THE INVENTION

An object of the invention is to provide a sputtering target based on an In—Ga—Zn oxide that rarely causes or shows an abnormal discharge and nodules.

The inventors of the invention conducted extensive studies, and found that an oxide mixture that includes a novel oxide having a novel crystal structure and $InGaZnO_4$ having a homologous crystal structure does not contain a $ZnGa_2O_4$ phase, suppresses an abnormal discharge and nodules, and may suitably be used as a sputtering target for forming an oxide semiconductor thin film. This finding has led to the completion of the invention.

Several aspects of the invention provide the following sputtering target and the like.

1. A sputtering target including an oxide A and $InGaZnO_4$,
   the oxide A being an oxide for which a diffraction peak is observed in the following regions A to K in a chart obtained by X-ray diffraction measurement (Cu—Kα),
   A. $2\theta=7.0°$ to $8.4°$
   B. $2\theta=30.6°$ to $32.0°$
   C. $2\theta=33.8°$ to $35.8°$
   D. $2\theta=53.5°$ to $56.5°$
   E. $2\theta=56.5°$ to $59.5°$
   F. $2\theta=14.8°$ to $16.2°$
   G. $2\theta=22.3°$ to $24.3°$
   H. $2\theta=32.2°$ to $34.2°$
   I. $2\theta=43.1°$ to $46.1°$
   J. $2\theta=46.2°$ to $49.2°$
   K. $2\theta=62.7°$ to $66.7°$.
2. The sputtering target according to 1, wherein a peak of a spinel structure represented by $ZnGa_2O_4$ determined by X-ray diffraction measurement (Cu—Kα) is 3% or less of a maximum peak.
3. The sputtering target according to 1 or 2, wherein an atomic ratio of indium (In), gallium (Ga), and zinc (Zn) satisfies expressions (1) and (2), $$0.25 \leq Zn/(In+Ga+Zn) \leq 0.55 \quad (1)$$

$$0.15 \leq Ga/(In+Ga+Zn) < 0.33 \quad (2).$$

4. The sputtering target according to 3, wherein an atomic ratio of indium (In) and zinc (Zn) satisfies an expression (3), $$0.51 \leq In/(In+Zn) \leq 0.68 \quad (3).$$

5. The sputtering target according to 3, wherein an atomic ratio of indium (In) and gallium (Ga) satisfies an expression (4), $$In/(In+Ga) \leq 0.58 \quad (4).$$

6. The sputtering target according to any one of 1 to 5, the sputtering target being produced by mixing a raw material powder of an indium compound and a raw material powder of a gallium compound, calcining the resulting mixture at 500° C. to 1200° C., mixing a raw material powder of a zinc compound with the fired mixture, and sintering the resulting mixture at 1100° C. to 1600° C.
7. The sputtering target according to any one of 1 to 6, the sputtering target having a resistivity of 10 MΩ·cm or less and a relative density of 95% or more.

8. An oxide thin film produced using the sputtering target according to any one of 1 to 7.

The aspects of the invention provide a sputtering target based on an In—Ga—Zn oxide that suppresses the occurrence of an abnormal discharge and nodules.

DESCRIPTION OF EMBODIMENTS

The sputtering target according to the invention includes an In—Ga—Zn oxide sintered body that includes indium (In), gallium (Ga), and zinc (Zn), and has the following crystal structures 1 and 2.
Crystal structure 1: oxide A specified as described below
Crystal structure 2: $InGaZnO_4$ having a homologous crystal structure The oxide A has a novel crystal structure found by the inventors of the invention. The inventors found that the oxide A can be obtained as substantially a single component by the method described later in connection with the experimental examples. The oxide A according to the invention can be identified from a chart obtained by X-ray diffraction measurement.

Figure 1:
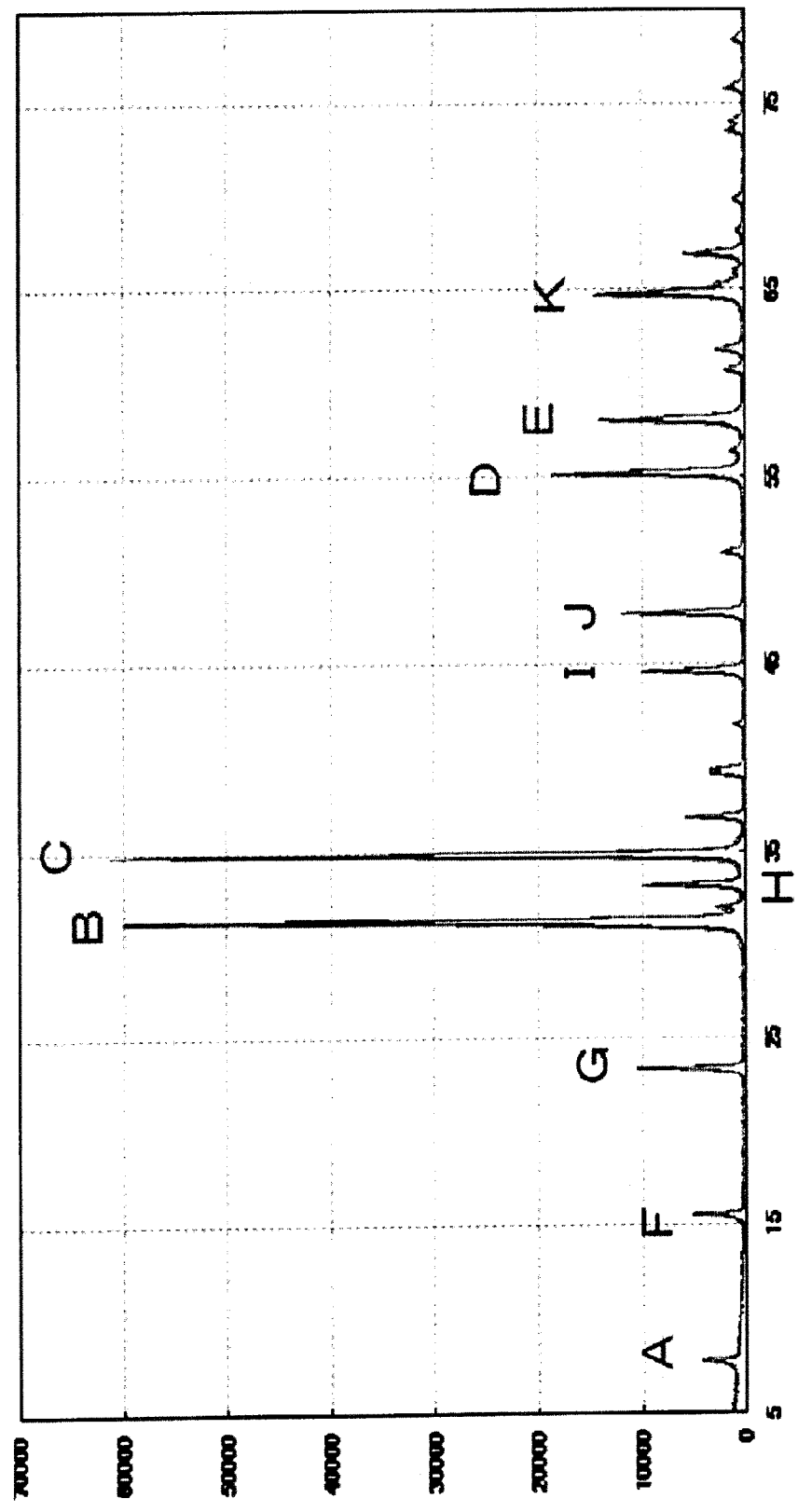
FIG. 1 illustrates the X-ray diffraction chart of the oxide A having peaks A to K.

FIG. 1 illustrates a chart of the oxide A generated in Experimental Example 1 that was obtained by X-ray diffraction measurement (Cu—Kα). As illustrated in FIG. 1, the following diffraction peaks are observed for the oxide A. Note that the horizontal axis indicates 2θ, and the vertical axis indicates intensity.
A. 2θ=7.0° to 8.4° (preferably 7.2° to 8.2°)
B. 2θ=30.6° to 32.0° (preferably 30.8° to 31.8°)
C. 2θ=33.8° to 35.8° (preferably 34.5° to 35.3°)
D. 2θ=53.5° to 56.5° (preferably 54.1° to 56.1°)
E. 2θ=56.5° to 59.5° (preferably 57.0° to 59.0°)
F. 2θ=14.8° to 16.2° (preferably 15.0° to 16.0°)
G. 2θ=22.3° to 24.3° (preferably 22.8° to 23.8°)
H. 2θ=32.2° to 34.2° (preferably 32.7° to 33.7°)
I. 2θ=43.1° to 46.1° (preferably 43.6° to 45.6°)
J. 2θ=46.2° to 49.2° (preferably 46.7° to 48.7°)
K. 2θ=62.7° to 66.7° (preferably 63.7° to 65.7°)

It is preferable that one of the diffraction peaks observed at an angle 2θ of 30.6° to 32.0° (region B) and an angle 2θ of 33.8° to 35.8° (region C) be a main peak, and the other diffraction peak be a sub-peak.

Note that the term "main peak" used herein refers to a peak having the highest intensity (height) within the range in which 2θ=5 to 80°, and the term "sub-peak" used herein refers to a peak having the second highest intensity (height) within the range in which 2θ=5 to 80°. When the main peak overlaps another peak, the intensity of the main peak can be calculated back from the intensity of the other peak.

The following X-ray diffraction measurement conditions are used in connection with the invention, for example.
System: "Ultima-III" manufactured by Rigaku Corporation
X-rays: Cu—Kα (wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm It was determined that the oxide A is a novel crystal since an oxide crystal for which the above peaks are observed in a chart obtained by X-ray diffraction measurement (Cu—Kα) is not found in the JCPDS (Joint Committee of Powder Diffraction Standards) database (cards).

Figure 2:
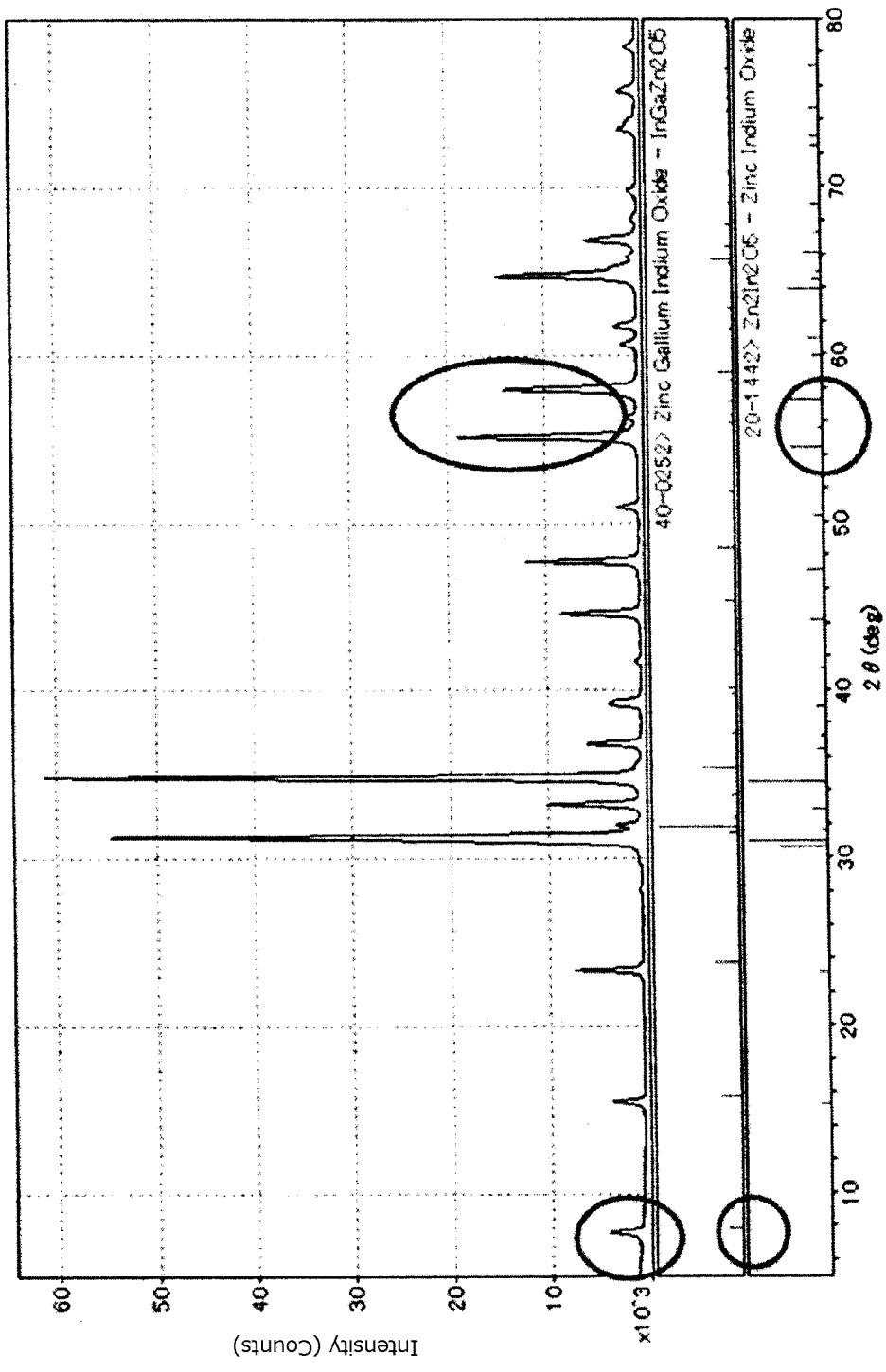
FIG. 2 is a view illustrating the X-ray diffraction charts of the oxide A, the crystal structure represented by $InGaO_3(ZnO)_2$ (JCPDS: 40-0252), and the crystal structure represented by $In_2O_3(ZnO)_2$ (JCPDS: 20-1442).

FIG. 2 illustrates the X-ray diffraction chart of the oxide A, the crystal structure represented by $InGaO_3(ZnO)_2$ (JCPDS: 40-0252), and the crystal structure represented by $In_2O_3(ZnO)_2$ (JCPDS: 20-1442). The X-ray diffraction chart of the oxide A is similar to the crystal structure represented by $InGaO_3(ZnO)_2$ (JCPDS: 40-0252) and the crystal structure represented by $In_2O_3(ZnO)_2$ (JCPDS: 20-1442). However, the oxide A has a peak characteristic of $InGaO_3(ZnO)_2$ (i.e., a peak in the region A), and peaks characteristic of $In_2O_3(ZnO)_2$ (i.e., peaks in the regions D and E). Therefore, it is considered that the oxide A has a novel periodicity differing from those of $InGaO_3(ZnO)_2$ and $In_2O_3(ZnO)_2$. Specifically, the oxide A differs from $InGaO_3(ZnO)_2$ and $In_2O_3(ZnO)_2$.

The peak in the region B is situated between the main peak (at about 31°) of $In_2O_3(ZnO)_2$ and the main peak (at about 32°) of $InGaO_3(ZnO)_2$. Therefore, the peak in the region B is shifted to the low-angle side (i.e., it is considered that the lattice spacing is large) from the main peak of $InGaO_3(ZnO)_2$, and is shifted to the high-angle side (i.e., it is considered that the lattice spacing is small) from the main peak of $In_2O_3(ZnO)_2$.

The oxide A may have excess oxygen or an oxygen deficiency (i.e., the atomic ratio of oxygen may differ from the stoichiometric ratio) as long as the oxide A shows its specific diffraction pattern when subjected to X-ray diffraction measurement. When the oxide A has excess oxygen, the resistivity of the resulting target may increase to a large extent. Therefore, it is preferable that the oxide A have an oxygen deficiency.

The homologous crystal structure represented by $InGaZnO_4$ is registered as the JCPDS (Joint Committee of Powder Diffraction Standards) card No. 38-1104, and can be specified by referring to the JCPDS card.

Note that the crystal form of $InGaZnO_4$ may be written as $InGaO_3(ZnO)$.

The crystal structure of $InGaZnO_4$ can be determined from the X-ray diffraction pattern, and may have excess oxygen or an oxygen deficiency (i.e., the atomic ratio of oxygen may differ from the stoichiometric ratio). Note that it is preferable that $InGaZnO_4$ have an oxygen deficiency. When $InGaZnO_4$ has excess oxygen, the resistivity of the resulting target may increase to a large extent.

The lattice constants calculated from X-ray diffraction may differ from those of JCPDS card No. 38-1104 as long as the pattern determined by X-ray diffraction measurement is identical (i.e., the structure is identical).

Likewise, the peak positions may differ from those of JCPDS card No. 38-1104 as long as the pattern determined by X-ray diffraction measurement is identical (i.e., the structure is identical). Note that it is considered that a shift to the low-angle side occurs due to replacement of the Ga site of $InGaO_3(ZnO)$ with In through solid dissolution, insertion of an atom between the lattices, or the like.

When it is difficult to identify the crystal phase from the X-ray diffraction peaks, the crystal phase can be identified by utilizing EPMA, μ-XRD (micro X-ray diffraction), or the like.

It is preferable that the amount of $InGaZnO_4$ be larger than that of the oxide A since there is a high possibility that the conductivity decreases.

The sputtering target according to the invention may include a crystal structure other than the crystal structure 1 and the crystal structure 2. A crystal phase that exhibits high conductivity (e.g., $In_2O_3$) is preferable as the crystal structure other than the crystal structure 1 and the crystal structure 2. It is preferable that the sputtering target does not include the spinel structure represented by $ZnGa_2O_4$.

Note that the absence of the spinel structure represented by $ZnGa_2O_4$ is determined by determining that the diffraction peaks of $ZnGa_2O_4$ are not observed in the X-ray diffraction chart. The expression "diffraction peaks of $ZnGa_2O_4$ are not observed" includes a case where the peak intensity is 0, and a case where the intensity ratio is 3% or less with respect to the maximum peak.

The content of each crystal can be calculated from the intensity ratio of the diffraction peaks in the X-ray diffraction chart.

It is preferable that the sputtering target according to the invention have an elemental composition in which the atomic ratio of indium (In), gallium (Ga), and zinc (Zn) satisfies the following expressions (1) and (2).

$$0.25 \leq Zn/(In+Ga+Zn) \leq 0.55 \quad (1)$$

$$0.15 \leq Ga/(In+Ga+Zn) < 0.33 \quad (2)$$

If the atomic ratio of Zn is less than 0.25 (see expression (1)), the crystal phase represented by $InGaZnO_4$ may not be easily generated. If the atomic ratio of Zn exceeds 0.55, the oxide A may not be easily produced.

The atomic ratio of Zn is preferably 0.30 to 0.50, more preferably 0.32 to 0.47, and particularly preferably 0.35 to 0.45. When the atomic ratio of Zn is within the above range, a target that includes the oxide A and the homologous structure represented by $InGaZnO_4$ can be easily generated.

If the atomic ratio of Ga is less than 0.15 (see expression (2)), a conductive thin film may be formed, and it may be difficult to implement TFT drive. If the atomic ratio of Ga is 0.33 or more, the mobility may decrease when producing a thin film transistor (semiconductor thin film).

The atomic ratio of Ga is preferably 0.18 to 0.30, and more preferably 0.20 to 0.28.

It is preferable that the sputtering target have an elemental composition in which the atomic ratio of indium (In) and zinc (Zn) satisfies the following expression (3). When the atomic ratio of In is 0.51 or more (see expression (3)), it is expected that the resulting thin film transistor exhibits improved mobility.

$$0.51 \leq In/(In+Zn) \quad (3)$$

Note that the ratio "In/(In+Zn)" is preferably 0.68 or less.

It is preferable that the sputtering target have an elemental composition in which the atomic ratio of indium (In) and gallium (Ga) satisfies the following expression (4). When the atomic ratio of In is 0.58 or less (see expression (4)), it is expected that the carrier concentration of the thin film can be easily controlled.

$$In/(In+Ga) \leq 0.58 \quad (4)$$

Note that the ratio "In/(In+Ga)" is preferably 0.2 or more, and more preferably 0.3 or more.

The atomic ratio of each element included in the target or the oxide thin film may be determined by quantitatively analyzing the elements using an inductively coupled plasma atomic emission spectrometer (ICP-AES).

Specifically, in the analysis using ICP-AES, when a solution sample is nebulized using a nebulizer, and introduced into an argon plasma (about 6000 to about 8000° C.), each element contained in the sample absorbs thermal energy, and is excited, and the orbital electrons migrate from the ground state to the orbital at a high energy level. The orbital electrons then migrate to the orbital at a lower energy level when about $10^{-7}$ to about $10^{-8}$ seconds has elapsed. In this case, the difference in energy is emitted as light. Since the emitted light has an element-specific wavelength (spectral line), the presence or absence of each element can be determined based on the presence or absence of the spectral line (qualitative analysis).

Since the intensity (luminous intensity) of each spectral line is in proportion to the amount (number) of each element contained in the sample, the element concentration in the sample can be determined by comparison with a standard solution having a known concentration (quantitative analysis).

After specifying the elements contained in the sample by qualitative analysis, the content of each element is determined by quantitative analysis, and the atomic ratio of each element is calculated from the results.

The sputtering target according to the invention consists essentially of an oxide of In, Ga, and Zn. The sputtering target according to the invention may include a metal element other than In, Ga, and Zn, such as Sn, Ge, Si, Sc, Ti, Zr, or Hf, and unavoidable impurities as long as the advantageous effects of the invention are not impaired.

The expression "consists essentially of" used herein means that 95 to 100 wt % (preferably 98 to 100 wt %) of the sputtering target is an oxide of In, Ga, and Zn.

The target according to the invention can be produced by sintering a raw material powder that includes each metal element, for example. Specifically, the target according to the invention can be produced by calcining $In_2O_3$ and $Ga_2O_3$, mixing ZnO with the calcining mixture, and sintering the resulting mixture. The raw material oxides are mixed so that the resulting target satisfies the expressions (1) and (2).

Each step is described below.

(1) Mixing step

In a mixing step, compounds of the metal elements included in the oxide according to the invention are mixed.

Powders such as a powder of an indium compound, a powder of a gallium compound, and a powder of a zinc compound are used as the raw materials. Examples of the indium compound include indium oxide, indium hydroxide, and the like. Examples of the gallium compound include gallium oxide, gallium hydroxide, and the like. Examples of the zinc compound include zinc oxide, zinc hydroxide, and the like. An oxide is preferable as the compound of each element due to ease of sintering and suppression of residual by-products.

The specific surface area (BET specific surface area) of indium oxide, gallium oxide, and zinc oxide is normally 3 to 18 $m^2/g$, 3 to 18 $m^2/g$, and 3 to 18 $m^2/g$, preferably 7 to 16 $m^2/g$, 7 to 16 $m^2/g$, and 3 to 10 $m^2/g$, more preferably 7 to 15 $m^2/g$, 7 to 15 $m^2/g$, and 4 to 10 $m^2/g$, and particularly preferably 11 to 15 $m^2/g$, 11 to 15 $m^2/g$, and 4 to 5 $m^2/g$, respectively. If the specific surface area is too small, aggregates of each element may be formed (grown) in the sintered body, the crystal form of the raw material powder may remain in the sintered body, or an unexpected crystal form may be produced, and a change in properties may occur, for example. If the specific surface area is too large, an unexpected crystal form may be produced, and a change in properties may occur, or inferior external appearance or nonuniform properties may be obtained due to inferior dispersion, for example.

The purity of each raw material is normally 2N (99 mass %) or more, preferably 3N (99.9 mass %) or more, and particularly preferably 4N (99.99 mass %) or more. If the purity is less than 2N, a deterioration in durability may occur, or burn-in may occur due to entrance of impurities into the liquid crystal.

It is preferable to use zinc metal (zinc powder) as part of the raw material. Occurrence of white spots can be suppressed by utilizing zinc powder.

When producing the target according to the invention, the indium compound and the gallium compound are mixed, and fired, and the zinc compound is mixed with the fired mixture. It is preferable to homogeneously mix and grind the raw materials using a normal mixer/grinder such as a wet ball mill, a bead mill, or an ultrasonic device.

(2) Calcining step

In a calcining step, the mixture of the indium compound and the gallium compound obtained by the above step is calcined. In and Ga are sufficiently mixed by calcination, and production of the spinel phase represented by $ZnGa_2O_4$ is suppressed.

In the calcining step, it is preferable to calcine the mixture of the indium compound and the gallium compound at 500 to 1200° C. for 1 to 100 hours. If the calcining temperature is less than 500° C., or the heating time is less than 1 hour, the indium compound and the gallium compound may not be sufficiently thermally decomposed. If the calcining temperature exceeds 1200° C., or the calcining time exceeds 100 hours, coarse particles may be produced.

Therefore, it is particularly preferable to calcine the mixture of the indium compound and the gallium compound at 800 to 1200° C. for 2 to 50 hours.

It is preferable to grind the resulting calcined product before the following forming step and firing step. The calcined product is preferably ground so that the volume average particle size (D50) of the raw material powders is reduced to 2 μm or less, more preferably 1 μm or less, and particularly preferably 0.5 μm or less. This aims at homogenously dispersing the raw materials. Raw material powder having a large particle size may cause local compositional non-uniformity. An abnormal discharge may occur during sputtering due to local compositional non-uniformity. Moreover, a difference in composition between the target and the thin film may occur due to compositional non-uniformity. It is preferable to grind the zinc compound together with the calcined product. Note that the zinc compound may be mixed after grinding the calcined product.

(3) Forming step

In the forming step, a mixture of the calcined product and the zinc compound is compression-formed to obtain a formed body. The mixture is formed by the forming step to have a shape suitable for the target. A fine powder of the calcined product may be granulated, and formed to have the desired shape.

The mixture may be formed by press forming (uniaxial forming), die forming, cast forming, injection forming, or the like. It is preferable to form the mixture by cold isostatic pressing (CIP) or the like in order to obtain a target having a high sintering density.

When the mixture is formed by press forming (uniaxial pressing), an unexpected crystal form may be produced due to non-uniform pressure.

The forming step may be performed in two or more stages by performing cold isostatic pressing (CIP), hot isostatic pressing (HIP), or the like after press forming (uniaxial pressing).

CIP (cold isostatic pressing (or an isostatic pressing apparatus) is preferably performed at a surface pressure of 800 to 4000 kgf/cm² for 0.5 to 60 minutes, and more preferably performed at a surface pressure of 2000 to 3000 kgf/cm² for 2 to 30 minutes. This makes it possible to reduce compositional non-uniformity inside the formed body (i.e., a uniform (homogenous) formed body can be obtained), for example. If the surface pressure is less than 800 kgf/cm², the sintered body may have a low density or high resistivity. Further, a large apparatus may be required to achieve a surface pressure of more than 4000 kgf/cm² (i.e., it may be uneconomical). If the holding time is less than 0.5 minutes, the sintered body may have a low density or high resistivity. If the holding time exceeds 60 minutes, it may be uneconomical.

A forming aid such as polyvinyl alcohol, methyl cellulose, polywax, or oleic acid may be used when forming the mixture.

(4) Sintering step

In the sintering step, the formed body obtained by the forming step is fired. The formed body may be fired by hot isostatic press (HIP) firing or the like.

The formed body is normally fired at 1100 to 1600° C. for 30 minutes to 360 hours, preferably 8 to 180 hours, and more preferably 12 to 96 hours. If the firing temperature is less than 1100° C., the density of the target may not increase, or sintering may take time. If the firing temperature exceeds 1600° C., a variation in composition may occur due to vaporization of the components, or the furnace may be damaged.

If the sintering time is less than 30 minutes, the density of the target may not increase. If the sintering time exceeds 360 hours, the production time may increase to a large extent, and the production cost may increase.

The formed body is normally fired in an oxygen-containing normal-pressure atmosphere (e.g., air) or an oxygen-containing pressurized atmosphere.

If the formed body is sintered in an oxygen-free atmosphere, or fired at 1600° C. or more, it may be difficult to sufficiently increase the density of the resulting target, or sufficiently suppress an abnormal discharge during sputtering.

The temperature increase rate during firing is normally 8° C./min or less, preferably 4° C./min or less, and more preferably 2° C./min or less. When the temperature increase rate during firing is 8° C./min or less, cracks rarely occur when increasing the temperature.

The temperature decrease rate during firing is normally 4° C./min or less, and preferably 2° C./min or less. When the temperature decrease rate during firing is 4° C./min or less, cracks rarely occur when decreasing the temperature.

(5) Reduction step

A reduction step is optionally provided so that the sintered body obtained by the firing step has a uniform bulk resistivity over the entire target.

Examples of a reduction method include reduction using a reducing gas, reduction using vacuum firing or an inert gas, and the like.

When employing reduction using a reducing gas, hydrogen, methane, carbon monoxide, a mixture of such a gas and oxygen, or the like may be used.

When employing reduction by firing in an inert gas, nitrogen, argon, a mixture of such a gas and oxygen, or the like may be used.

The reduction temperature is normally 100 to 800° C., and preferably 200 to 800° C. The reduction time is normally 0.01 to 10 hours, and preferably 0.05 to 5 hours.

An oxide sintered body that includes both the crystal structure 1 and the crystal structure 2 can be obtained by the above steps. The oxide sintered body exhibits high relative density, low resistivity (high conductivity), high flexural strength, high uniformity (homogeneity), and is suitable as a target for producing an oxide thin film such as an oxide semiconductor or a transparent conductive film.

The oxide sintered body is optionally processed to have the desired shape.

The oxide sintered body is processed by cutting the oxide sintered body to have a shape suitable for installation in a sputtering apparatus, or cutting the oxide sintered body for attaching a jig (e.g., backing plate). When producing a sputtering target using the oxide sintered body, the oxide sintered body is ground using a surface grinder to have a surface roughness Ra of 5 μm or less, for example. The sputtering surface of the sputtering target may be mirror-finished to have an average surface roughness Ra of 1000 Å or less. The sputtering target may be mirror-finished (polished) by a known polishing technique such as mechanical polishing, chemical polishing, or mechanochemical polishing (i.e., a combination of mechanical polishing and chemical polishing). For example, the sputtering target may be polished (#2000 or more) using a fixed abrasive polisher (polishing liquid: water), or may be lapped using a free abrasive lap (polishing agent: SiC paste or the like), and then lapped using a diamond paste.

The polishing method is not particularly limited.

It is preferable to clean the target after polishing. The target may be cleaned by blowing air, or may be cleaned using running water, for example. When removing foreign matter by blowing air, foreign matter can be more effectively removed by sucking air using a dust collector from the side opposite to the nozzle. Note that the target may be further cleaned by ultrasonic cleaning or the like since the above cleaning method has a limitation. When using ultrasonic cleaning, it is effective to produce ultrasonic waves at a frequency of 25 to 300 KHz. For example, it is preferable to perform ultrasonic cleaning while producing twelve types of ultrasonic waves at intervals of 25 KHz within a frequency range of 25 to 300 KHz.

The resulting sputtering target is bonded to a backing plate. The thickness of the target is normally 2 to 20 mm, preferably 3 to 12 mm, and particularly preferably 4 to 10 mm. A plurality of targets may be bonded to a single backing plate, and may be used as a single target.

The relative density of the sputtering target is preferably 95% or more, and more preferably 96% or more. If the relative density of the target is less than 95%, the target may easily break, or an abnormal discharge may easily occur.

The term "relative density" refers to the density that is calculated relative to the theoretical density calculated from the weighted average. The theoretical density refers to density calculated from the weighted average of the density of each raw material (=100%).

The resistivity of the target is preferably 0.01 to 10 mΩ·cm, more preferably 0.1 to 5 mΩ·cm, and particularly preferably 0.2 to 3 mΩ·cm. If the resistivity of the target exceeds 10 mΩ·cm, a spark may occur due to an abnormal discharge when DC sputtering is continuously performed for a long time, and the target may break, or particles scattered due to a spark may adhere to a film-forming substrate, and the performance of the oxide semiconductor film may deteriorate. If the resistivity of the target is less than 0.1 mΩ·cm, the resistivity of the target may be lower than that of particles, and an abnormal discharge may occur due to scattered particles.

An oxide thin film can be formed on an object such as a substrate by sputtering using the sputtering target according to the invention. The oxide thin film may suitably be used as a semiconductor layer, an oxide thin film layer, or the like of a thin film transistor.

The thickness of the oxide thin film is preferably 1 to 45 nm, more preferably 3 to 30 nm, and particularly preferably 5 to 20 nm. When the thickness of the oxide thin film is 45 nm or less, it is expected that a semiconductor that has high mobility and a small S-factor is obtained.

EXAMPLES

Experimental Examples (1) Production of Oxide A $In_2O_3$ (manufactured by Nippon Rare Metal, Inc., purity: 4N), $Ga_2O_3$ (manufactured by Nippon Rare Metal, Inc., purity: 4N), and ZnO (manufactured by Kojundo Chemical Lab. Co., Ltd., purity: 4N) were used as starting materials.

The starting materials were weighed so that the atomic ratio "In:Ga:Zn" was 37.5:12.5:50.0, and mixed and ground using a wet agitated media mill. Zirconia beads having a diameter of 1 mm were used as the media for the wet agitated media mill.

The mixed and ground materials were then dried using a spray dryer. A die was filled with the resulting mixed powder, and the mixed powder was press-formed using a cold press machine to obtain a formed body.

The formed body was sintered using an electric furnace. The following sintering conditions were used. The resulting sintered body was an oxide A that was substantially a single component.

Temperature increase rate: 2° C./min
Sintering temperature: 1480° C.
Sintering time: 6 hours
Sintering atmosphere: oxygen
Temperature decrease time: 72 hours The oxide A can be obtained by the above method. Note that the forming step may be performed in two or more stages by performing cold isostatic pressing (CIP), hot isostatic pressing (HIP), or the like after press forming (uniaxial pressing). A binder may be added.

(2) X-Ray Diffraction Measurement of Oxide A

The oxide A was subjected to X-ray diffraction measurement under the conditions employed in Example 1. The resulting chart is shown in Table 1.

Example 1

(1) Production of Oxide Sintered Body $In_2O_3$ (manufactured by Nippon Rare Metal, Inc., purity: 4N), $Ga_2O_3$ (manufactured by Nippon Rare Metal, Inc., purity: 4N), and ZnO (manufactured by Kojundo Chemical Lab. Co., Ltd., purity: 4N) were used as starting materials. The starting materials were weighed so that the atomic ratio "In:Ga:Zn" was 42:20:38. The $In_2O_3$ and $Ga_2O_3$ were mixed and ground using a wet agitated media mill, put in a saggar, and fired at 900° C. for 4 hours in air. Zirconia beads having a diameter of 1 mm were used as the media for the wet agitated media mill. The mixed fired product of $In_2O_3$ and $Ga_2O_3$, and ZnO were mixed and ground using a wet agitated media mill. The ground materials were dried using a spray dryer. A die was filled with the resulting mixed powder, and the mixed powder was press-formed by cold isostatic pressing (CIP) at a surface pressure of 2200 $kgf/cm^2$ for 5 minutes to obtain a formed body.

The formed body was sintered using an electric furnace. The following sintering conditions were used.
Temperature increase rate: 2° C./min
Sintering temperature: 1400° C.
Sintering time: 5 hours
Sintering atmosphere: oxygen stream
Temperature decrease time: 72 hours (2) Production of Sputtering Target The sintered body having a thickness of 6 mm was ground to have a thickness of 5 mm and a diameter of 4 inches, and polished. A target sintered body was cut from the sintered body. The side of the sintered body was cut using a diamond cutter, and the surface of the sintered body was ground using a surface grinder to have a surface roughness Ra of 0.5 µm or less.

The surface of the ground sintered body was cleaned by blowing air, and then subjected to ultrasonic cleaning for 3 minutes while producing twelve types of ultrasonic waves at intervals of 25 KHz within a frequency range of 25 to 300 KHz to obtain a target.

The target was bonded to a backing plate made of oxygen-free copper using indium solder to obtain a target. The target had a surface roughness Ra of 0.5 µm or less, and had a ground surface showing no directivity.

(3) Evaluation of Target

The resulting oxide sintered body (target) was evaluated as described below. The results are shown in Table 1.
(A) Ratio of metal elements
The ratio of the metal elements was analyzed using an inductively coupled plasma atomic emission spectrometer (ICP-AES, manufactured by Shimadzu Corporation).
(B) Crystal structure
The crystal structure was determined by X-ray-diffraction measurement (XRD) under the following conditions.
The analysis results are shown in Table 1. In Table 1, "○" indicates that a peak was observed, and "-" indicates that a peak was not observed. More specifically, "-" indicates that a peak was 3% or less with respect to the maximum peak.
Note that the crystal structure of the oxide A was determined using the chart shown in FIG. 1.
System: "Ultima-III" manufactured by Rigaku Corporation
X-rays: Cu—Kα line (wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm
(C) Characteristics of target
(a) Relative density
The relative density was calculated by the following expression from the theoretical density calculated from the density of the raw material powder and the density of the sintered body measured by the Archimedes' method.

Relative density=(density measured by Archimedes' method)÷(theoretical density)×100(%)

(b) Bulk resistivity
The resistivity was measured in ten points by a four-probe method (JIS R 1637) using a resistivity meter ("Loresta" manufactured by Mitsubishi Chemical Corporation), and the average value was taken as the bulk resistivity.
(c) Uniformity of resistivity
The resistivity was measured in ten points by a four-probe method (JIS R 1637) using a resistivity meter ("Loresta" manufactured by Mitsubishi Chemical Corporation), and the uniformity of the resistivity was calculated by the following expression from the average value of the resistivity of the ten points and the standard deviation.

(Standard deviation)÷(average value)×100(%)

(D) Film-forming capability of target
(a) Nodule
The target was placed in a DC sputtering system. Continuous sputtering was performed at a DC output of 200 W for 100 hours in an Ar atmosphere (0.3 Pa), and occurrence of nodules on the surface of the target was observed with the naked eye.
(b) Abnormal discharge
The sputtering target was placed in a DC sputtering system, and continuous sputtering was performed using argon as a sputtering gas (0.3 Pa, DC output: 200 W, 10 kWhr). A change in voltage during sputtering was stored in a data logger to determine the presence or absence of an abnormal discharge. The presence or absence of an abnormal discharge was detected by monitoring a change in voltage. The results are shown in Table 1. It was determined that an abnormal discharge occurred when a change in voltage that occurred within 5 minutes during the measurement was equal to or more than 10% of the constant voltage during sputtering.

Example 2

A target was produced, and evaluated in the same manner as in Example 1 (see (1) to (3)), except that the starting materials were used so that the atomic ratio "In:Ga:Zn" was 50:18:32. The results are shown in Table 1.

Example 3

A target was produced, and evaluated in the same manner as in Example 1 (see (1) to (3)), except that the starting materials were used so that the atomic ratio "In:Ga:Zn" was 33:20:47. The results are shown in Table 1.

Example 4

A target was produced, and evaluated in the same manner as in Example 1 (see (1) to (3)), except that the starting materials were used so that the atomic ratio "In:Ga:Zn" was 28:28:44. The results are shown in Table 1.

Comparative Example 1

(1) Production of Oxide Sintered Body $In_2O_3$ (manufactured by Nippon Rare Metal, Inc., purity: 4N), $Ga_2O_3$ (manufactured by Nippon Rare Metal, Inc., purity: 4N), and ZnO (manufactured by Kojundo Chemical Lab. Co., Ltd., purity: 4N) were used as starting materials.
The starting materials were weighed so that the atomic ratio "In:Ga:Zn" was 33.3:33.3:33.3, and mixed and ground using a wet agitated media mill. Zirconia beads having a diameter of 1 mm were used as the media for the wet agitated media mill.

The mixed and ground materials were dried using a spray dryer. A die was filled with the resulting mixed powder, and the mixed powder was press-formed by cold isostatic pressing (CIP) at a surface pressure of 2200 kgf/cm² for 5 minutes to obtain a formed body.

The formed body was sintered using an electric furnace. The following sintering conditions were used.
Temperature increase rate: 2° C./min
Sintering temperature: 1400° C.
Sintering time: 5 hours
Sintering atmosphere: oxygen
Temperature decrease time: 72 hours (2) Production and Evaluation of Target A target was produced, and evaluated in the same manner as in Example 1 (see (2) and (3)). The results are shown in Table 1.

Comparative Example 2

A target was produced, and evaluated in the same manner as in Example 1 (see (1) to (3)), except that the starting materials were used so that the atomic ratio "In:Ga:Zn" was 33.3:33.3:33.3. The results are shown in Table 1.

The documents described in the specification are incorporated herein by reference in their entirety.

The invention claimed is:

1. A sputtering target comprising an oxide A and $InGaZnO_4$,
   the oxide A being an oxide for which a diffraction peak is observed in the following regions A to K in a chart obtained by X-ray diffraction measurement (Cu—Kα),
   A. $2\theta=7.0°$ to $8.4°$
   B. $2\theta=30.6°$ to $32.0°$
   C. $2\theta=33.8°$ to $35.8°$
   D. $2\theta=53.5°$ to $56.5°$
   E. $2\theta=56.5°$ to $59.5°$
   F. $2\theta=14.8°$ to $16.2°$
   G. $2\theta=22.3°$ to $24.3°$
   H. $2\theta=32.2°$ to $34.2°$
   I. $2\theta=43.1°$ to $46.1°$
   J. $2\theta=46.2°$ to $49.2°$
   K. $2\theta=62.7°$ to $66.7°$.

2. The sputtering target according to claim 1, wherein a peak of a spinel structure represented by $ZnGa_2O_4$ determined by X-ray diffraction measurement (Cu—Kα) is 3% or less of a maximum peak.

3. The sputtering target according to claim 1, wherein an atomic ratio of indium (In), gallium (Ga), and zinc (Zn) satisfies expressions (1) and (2), $$0.25 \leq Zn/(In+Ga+Zn) \leq 0.55 \quad (1)$$

$$0.15 \leq Ga/(In+Ga+Zn) < 0.33 \quad (2).$$

TABLE 1

| | | | Example | | | | Comparative Example | |
|---|---|---|---|---|---|---|---|---|
| | | | 1 | 2 | 3 | 4 | 1 | 2 |
| Composition (atomic ratio) of sintered body | In/(In + Ga + Zn) | | 42 | 50 | 33 | 28 | 33.3 | 33.3 |
| | Ga/(In + Ga + Zn) | | 20 | 18 | 20 | 28 | 33.3 | 33.3 |
| | Zn/(In + Ga + Zn) | | 38 | 32 | 47 | 44 | 33.3 | 33.3 |
| Crystals of target | $ZnGa_2O_4$ | JCPDS card No. 38-1240 | — | — | — | — | ○ | ○ |
| | $InGaZnO_4$ | JCPDS card No. 38-1104 | ○ | ○ | ○ | ○ | ○ | ○ |
| | Oxide A | Not registered in JCPDS cards | ○ | ○ | ○ | ○ | — | — |
| | $In_2O_3$ | JCPDS card No. 060416 | — | ○ | — | — | ○ | ○ |
| Characteristics of target | Relative density (%) | | 95 | 96 | 95 | 95 | 90 | 93 |
| | Bulk resistivity (mΩ · cm) | | 2 | 1 | 1 | 2 | 19 | 12 |
| | Uniformity of resistivity | | <5% | <5% | <5% | <5% | <20% | <10% |
| Film-forming capability of target | Nodules | | 0 | 0 | 0 | 0 | 21 | 11 |
| | Abnormal discharge | | Did not occur | Did not occur | Did not occur | Did not occur | Occurred | Occurred |

As is clear from the results shown in Table 1, it was confirmed that the targets of Examples 1 to 4 did not show an abnormal discharge and nodules, and can be used advantageously. The production method employed in Examples 1 to 4 and Comparative Example 2 was effective to decrease the bulk resistivity, improve the uniformity of the resistivity, and suppress an abnormal discharge.

INDUSTRIAL APPLICABILITY

The sputtering target according to the invention may suitably be used to form an oxide thin film. The oxide thin film formed may be used as a semiconductor layer of a thin film transistor, for example.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

4. The sputtering target according to claim 3, wherein an atomic ratio of indium (In) and zinc (Zn) satisfies an expression (3), $$0.51 \leq In/(In+Zn) \leq 0.68 \quad (3).$$

5. The sputtering target according to claim 3, wherein an atomic ratio of indium (In) and gallium (Ga) satisfies an expression (4), $$In/(In+Ga) \leq 0.58 \quad (4).$$

6. The sputtering target according to claim 1, the sputtering target being produced by mixing a raw material powder of an indium compound and a raw material powder of a gallium compound, calcining the resulting mixture at 500° C. to 1200° C., mixing a raw material powder of a zinc compound with the calcined mixture, and sintering the resulting mixture at 1100° C. to 1600° C.

7. The sputtering target according to claim 1, the sputtering target having a resistivity of 10 mΩ·cm or less and a relative density of 95% or more.

8. An oxide thin film deposited using the sputtering target according to claim 1.

* * * * *